(12) United States Patent
Wang et al.

(10) Patent No.: US 8,503,601 B2
(45) Date of Patent: Aug. 6, 2013

(54) GATE-ON ARRAY SHIFT REGISTER

(75) Inventors: Po-Kai Wang, Hsin-Chu (TW);
Chun-Hao Huang, Hsin-Chu (TW);
Chung-Hung Peng, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 10 days.

(21) Appl. No.: 13/241,590

(22) Filed: Sep. 23, 2011

(65) Prior Publication Data

US 2012/0093276 A1   Apr. 19, 2012

(30) Foreign Application Priority Data

Oct. 13, 2010  (TW) ................................. 99134861 A

(51) Int. Cl.
*G11C 19/00* (2006.01)
(52) U.S. Cl.
USPC .................................. 377/64; 377/78; 377/79
(58) Field of Classification Search
None
See application file for complete search history.

(56) References Cited

U.S. PATENT DOCUMENTS

| | | | |
|---|---|---|---|
| 5,859,630 A | 1/1999 | Huq | |
| 7,688,934 B2 * | 3/2010 | Tsai et al. | 377/64 |
| 7,852,976 B2 | 12/2010 | Chen et al. | |
| 7,953,201 B2 * | 5/2011 | Tsai et al. | 377/64 |
| 2007/0237285 A1 * | 10/2007 | Chien et al. | 377/64 |
| 2010/0260312 A1 * | 10/2010 | Tsai et al. | 377/79 |
| 2010/0328293 A1 * | 12/2010 | Chien et al. | 345/211 |
| 2011/0007863 A1 * | 1/2011 | Tsai et al. | 377/79 |
| 2011/0142192 A1 * | 6/2011 | Lin et al. | 377/77 |
| 2012/0140871 A1 * | 6/2012 | Yang et al. | 377/79 |
| 2012/0155604 A1 * | 6/2012 | Yang et al. | 377/79 |
| 2012/0169581 A1 * | 7/2012 | Su et al. | 345/100 |

* cited by examiner

*Primary Examiner* — Tuan T Lam
(74) *Attorney, Agent, or Firm* — WPAT, PC; Justin King

(57) ABSTRACT

A gate-on array shift register includes a signal-input unit, a control transistor and at least three stable modules. The signal-input unit receives and outputs a previous-stage output signal. The control terminal of the control transistor is electrically coupled to the signal-input unit for receiving the previous-stage output signal. The control transistor outputs corresponding output signal on output terminal of the shift register according to the previous-stage output signal. Each of the stable modules is electrically coupled to the control terminal of the control transistor and the output terminal of the shift register to stabilize voltage of the terminals.

6 Claims, 6 Drawing Sheets

GATE-ON ARRAY SHIFT REGISTER

TECHNICAL FIELD

The disclosure relates to gate-on array shift registers, and more particularly to a gate-on array shift register with at least three stable modules.

BACKGROUND

In recent years, as technology advances, the liquid crystal displays become increasingly popular, because they are light and thin. Presently, the driver circuits for liquid crystal display are mainly implemented by the outer ICs, but this increase cost of the product and make the panel thinner.

Therefore, the gate drivers are produced with the process of thin film transistor on array substrate. This is known as Gate-On Array (GOA) technology. In GOA technology, the gate drivers can be directly arranged around the panel to reduce the production processes and product cost, and to make the panel thinner. However, in current GOA technology, potential drop is in turn controlled by two sets of signals, having 50% duty cycle. In such conditions, the transistors which are responsible for pulling down potential are kept in a positive state for a long time and cannot get enough rest, so the reliability of these transistors would be declined rapidly, resulting in low display quality or even damage to the display device.

SUMMARY OF DISCLOSURE

Therefore, the disclosure is to provide a gate-on array shift register which can be applied to drive circuits of flat panel displays to improve reliability of transistors.

A gate-on array shift register of an embodiment comprises a signal input unit, a control transistor and at least three stable modules. The control transistor comprises two terminals and a control terminal, the control terminal of the control transistor is electrically coupled to the signal input unit to receive the previous-stage output signal, one terminal of the control transistor is for receiving a first clock signal and another terminal of the control transistor is coupled to the output terminal of the gate-on array shift register, the control transistor is conducted at a first pulse period of the first clock pulse signal. The stable modules are respectively electrically coupled to the control terminal of the control transistor and the output terminal of the gate-on array shift register, and stabilizes the control terminal of the control transistor and the output terminal of the gate-on array shift register at a specific potential when a corresponding clock pulse signal and the previous-stage pulse signal are enabled, each of the stable modules has a work clock with a frequency different from the frequency of the first clock signal, and enable periods of the work clocks of the stable modules are different from each other and work cycles of the work clocks are respectively less than 50%.

In one embodiment, the signal input unit is a transistor, the transistor comprises two terminals and a control terminal, the control terminal of the transistor and one terminal of the transistor are electrically coupled together for receiving the previous-stage output signal, another terminal of the transistor is electrically coupled to the control terminal of the control transistor.

In one embodiment, each stable module comprises a first transistor, a second transistor, a third transistor, a fourth transistor and a fifth transistor. The control terminal and one terminal of the first transistor are electrically coupled and receiving a low frequency clock signal, another terminal of the first transistor is electrically coupled to a first node. The control terminal of the second transistor receives an inverse low frequency clock signal which is inverted to the low frequency clock signal, one terminal of the second transistor is electrically coupled to the first node, and another terminal of the second transistor is electrically coupled a preset potential. The control terminal of the third transistor is electrically coupled to the control terminal of the control transistor, one terminal of the third transistor is electrically coupled to the first node, and another terminal of the third transistor is electrically coupled to the preset potential. The control terminal of the fourth transistor is electrically coupled to the first node, one terminal of the fourth transistor is electrically coupled the control terminal of the control transistor, and another terminal of the fourth transistor is electrically coupled to output terminal of the gate-on array shift register. The control terminal of the fifth transistor is electrically coupled to the first node, one terminal of the fifth transistor is electrically coupled to the output terminal of the gate-on array shift register, and another terminal of the fifth transistor is electrically coupled to the preset potential.

In one embodiment, the stable modules comprise same circuits. In another embodiment, the stable modules comprise different circuits.

The gate-on array shift register uses multiple stable modules to alternately work so as to increase reliability of transistors, and work cycles of work clocks of the stable modules are respectively less than 50% to thereby keep each stable module from being conducted from a long time. This can eliminate DC bias on the transistors and eliminate probability of changes to operating characteristics.

DETAILED DESCRIPTION OF EMBODIMENTS

The disclosure will now be described more specifically with reference to the following embodiments. It is to be noted that the following descriptions of embodiments are presented herein for purpose of illustration and description only. It is not intended to be exhaustive or to be limited to the precise form disclosed.

Figure 1:
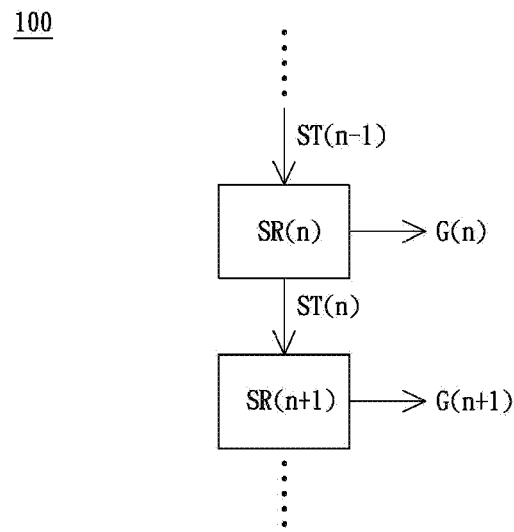
FIG. 1 is block diagram of a part circuit of a gate-on array shift register, according to an embodiment.

FIG. 1 is a block diagram of a part circuit of a gate-on array shift register, according to an embodiment. As shown in FIG. 1, a gate-on array shift register circuit 100 as shown in FIG. 1 is suitable for being used in gate drivers of various flat panel displays, such as liquid crystal displays, to in turn drive the gate lines of the flat panel displays. The gate-on array shift register circuit 100 comprises multiple gate-on array shift registers, for example, the gate-on array shift registers SR(n) and SR(n+1) and so on, cascade coupled together. Each gate-on array shift register receives a input signal, for example, a previous-stage pulse signal, such as ST(n−1) or ST(n), and generates a corresponding output pulse signal, such as, G(n) or G(n+1). The output signal generated by each gate-on array shift register is transmitted to a next-stage gate-on array shift register, in order to trigger the next-stage gate-on array shift register.

Figure 2:
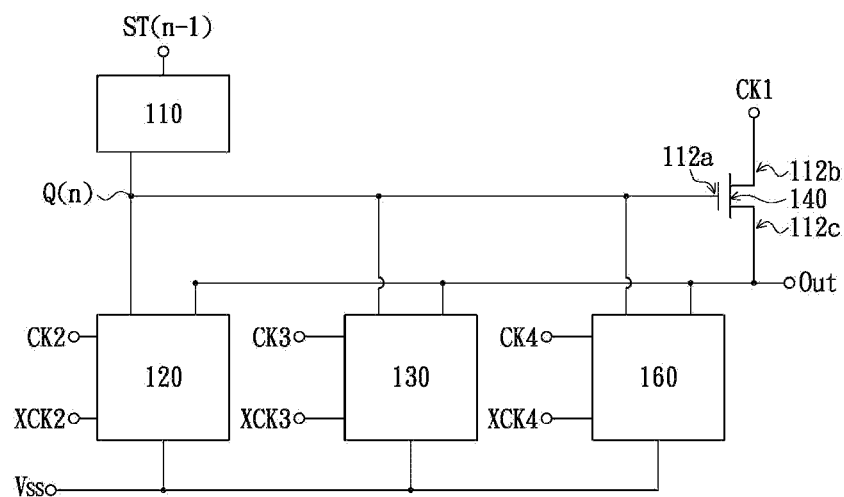
FIG. 2 is a block diagram of a gate-on array shift register having three stable modules, according to an embodiment.

FIG. 2 is a block diagram of a gate-on array shift register having three stable modules, according to an embodiment. The gate-on array shift register SR(n) of FIG. 1 is embodied in FIG. 2. In detail, the gate-on array shift register SR(n) comprises a signal input unit 110, stable modules 120, 130, 160 and a control transistor 140. The signal input unit 110 has two terminals, one terminal of the signal input unit 110 is used for receiving the previous-stage output signal ST(n−1), and the other terminal of the signal input unit 110 provides the received previous-stage output signal ST(n−1) to a control point Q(n).

Figure 3A:
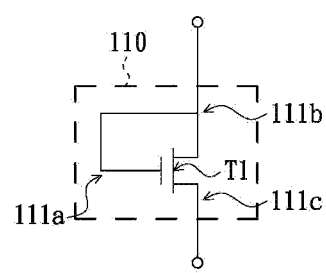
FIG. 3(A) is a circuit diagram of a signal input unit, according to an embodiment.

Specifically, please refer to FIG. 3(A), the signal input unit 110 comprises a transistor T1. The gate terminal (control terminal) 111a of the transistor T1 is electrically coupled to the drain terminal 111b of the transistor T1, and receives the previous-stage output pulse signal ST(n−1). The source terminal 111c of the transistor T1 is electrically coupled to the control point Q(n), so that the control point Q(n) can be charged by the previous-stage output signal ST(n−1) outputted from the source terminal 111c of the transistor T1.

Please refer to FIG. 2, the gate terminal 112a of the control transistor 140 is electrically coupled to the control point Q(n), in order to determine whether the control transistor 140 is conducted according to the potential of the control point Q(n). The drain terminal 112b of the control transistor 140 is configured for receiving the clock signal CK1. The source terminal 112c of the control transistor 140 is electrically coupled to the output terminal Out of the gate-on array shift register SR(n) to generate the output pulse signal G(n).

In this embodiment, the stable modules 120, 130 and 160 are formed in parallel state. Parallel here means electrical connection between the stable modules 120, 130, 160 are same, that is, all of the stable modules 120, 130, 160 are electrically connected to the control point Q(n), the output terminal Out of the shift register and the low preset potential VSS (also called as specific potential), and the connection modes of the stable modules 120, 130 and 160 respectively with the control point Q(n), the output terminal Out of shift registers and the low preset potential VSS are also same. Specifically, the control point Q(n) and the output terminal of the shift register can be stabilized at the low preset potential VSS by the stable modules 120, 130, 160, during a specific time period when the previous-stage output signal ST(n−1) is disabled. Hereafter, configuration and operation mode of one stable module is exemplarily illustrated, and the description of the configuration and operation mode of one stable module can be referenced by the other stable modules.

Figure 3B:
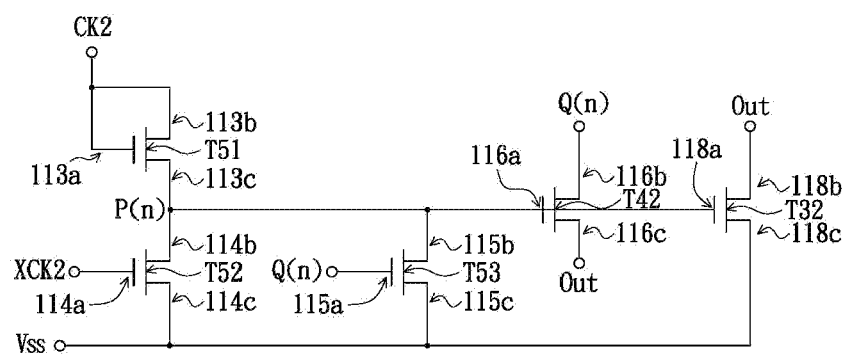
FIG. 3(B) is a circuit diagram of a stable module according to an embodiment.

Please refer to FIG. 3(B), it is a circuit diagram of a stable module according to an embodiment. In this embodiment, the stable module comprises a first transistor T51, a second transistor T52, a third transistor T53, a fourth transistor T42, and a fifth transistor T32. The gate terminal 113a of the first transistor T51 is electrically coupled to and receives low frequency clock signal CK2, the drain terminal 113b of the first transistor T51 is also electrically coupled to low frequency clock signal CK2, and the source terminal 113c of the first transistor T51 and the drain terminal 114b of the second transistor T52 are electrically coupled to the node P(n). The gate terminal 114a of the second transistor T52 receives an inverse low frequency clock signal XCK2 which is inverted to the low frequency clock signal CK2. The source terminal 114c of the second transistor T52 is electrically coupled to the low preset potential VSS. The gate terminal 115a of the third transistor T53 is electrically coupled to the control points Q(n), the drain terminal 115b of the third transistor T53 is electrically coupled to the node P(n), and the source terminal 115c of the third transistor T53 is electrically coupled to the low preset potential VSS. The gate terminal of the fourth transistor T42 is electrically coupled to the node P(n), the drain terminal 116b of the fourth transistor T42 is electrically coupled to the control point Q(n), and the source terminal 116c of the fourth transistor T42 is electrically coupled to the output terminal Out of the shift register. The gate terminal 118a of the fifth transistor T32 is electrically coupled to the node P(n), the drain terminal 118b is electrically coupled to the output terminal Out of the shift register, and the source terminal 118c of the fifth transistor T32 is electrically coupled to the low preset potential VSS.

Figure 4:
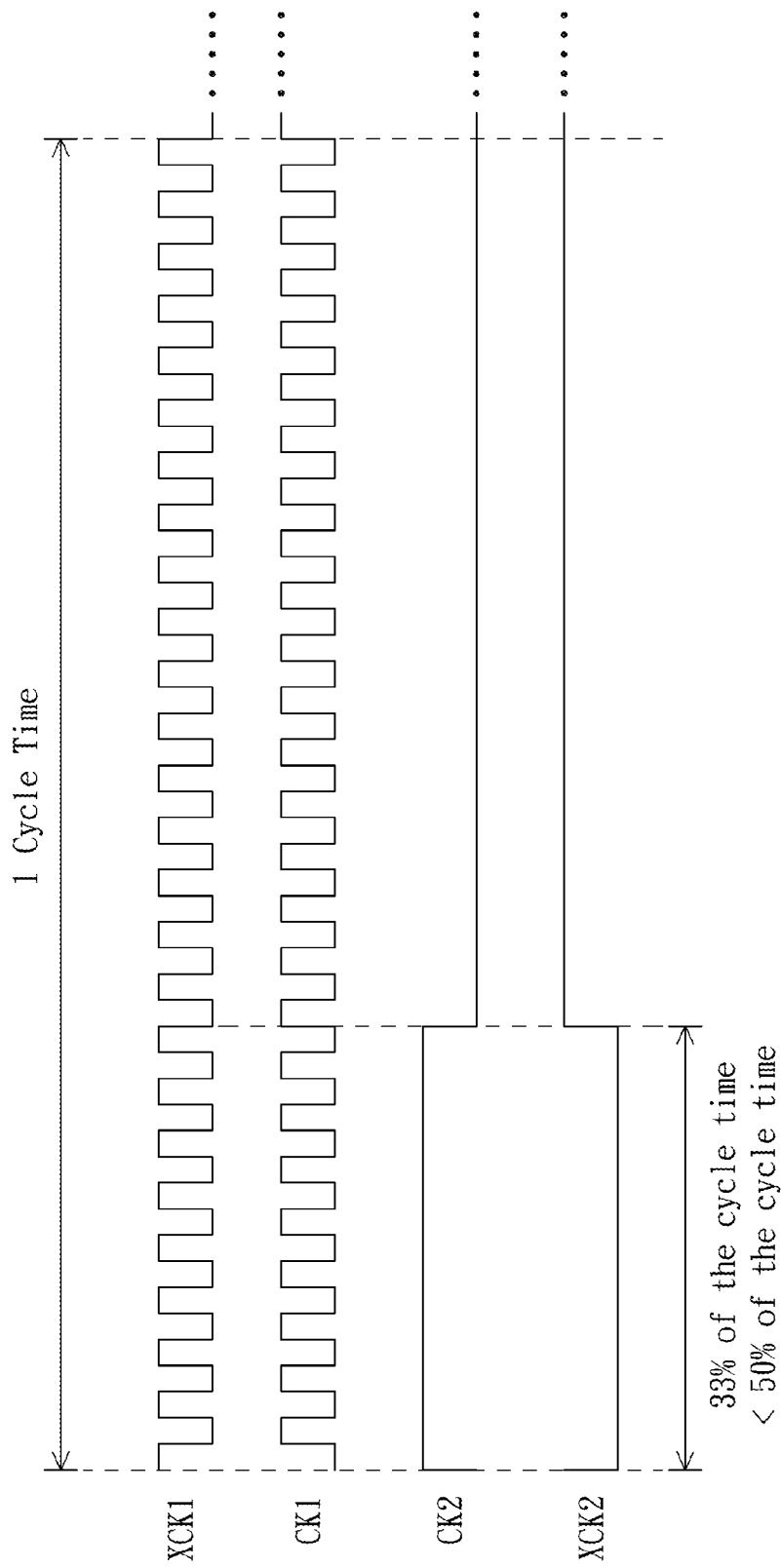
FIG. 4 is a timing diagram of various clock signals in the gate-on array shift registers of FIG. 2 and FIG. 3(B).

In practice, the clock signal CK2 has a frequency much lower than the frequency of the clock signal CK1 received by the control transistor 140. FIG. 4 is a timing diagram of various clock signals in the gate-on array shift registers of FIG. 2 and FIG. 3(B). FIG. 4 only schematically illustrates the time relationship of the clock signals, but not shows the actual time proportion. In the general case, the cycle of the clock signal CK1 is about 20 microseconds, the actual values are determined according to the amount of the gate lines of the flat panel display and the frame frequency of the display. The cycle of the low frequency clock signal CK2 is about 2 seconds, which is greatly different from the cycle of the clock signal CK1.

Please also refer to FIG. 3 (B) and FIG. 4, when the low frequency clock signal CK2 is enabled with a high level, the inverse low frequency clock signal XCK2 is disabled with a low level. Therefore, the second transistor T52 is closed, and the low frequency clock signal CK2 is transmitted to the node P(n) through the first transistor T51, so that the node P(n) is also at a high level. If the previous-stage output signal ST(n−1) is at a low level at this time, that is, the shift register does not work, the third transistor T53 is closed because the control point Q(n) is also at a low level, so that the node P(n) is remained at a high level to make the fourth transistor T42 and the fifth transistor T32 to be conducted. Thus, the output terminal Out is stabilized at the low preset potential VSS through the fifth transistor T32, and the control point Q(n) is stabilized at the potential of the output terminal Out through the fourth transistor T42, that is the control point Q(n) is stabilized at the low preset potential VSS.

Once the previous-stage output signal ST(n−1) is pulled up to a high level, the shift register SR(n) must begin to drive the corresponding gate line. At this point, the control point Q(n) is thereby pulled up to a high level by the signal input unit 110, so that the third transistor T53 is conducted and the potential of the node P(n) is pull down to the low preset potential VSS. Since the potential of the node P(n) is pulled down to the low preset potential VSS, the fourth transistor T42 and the fifth transistor T32 are closed, the potentials of the control point Q(n) and output terminal Out are not impacted by the low preset potential VSS to thereby promote a follow-up gate line.

On the other hand, when the low frequency clock signal CK2 is disabled, the second transistors T52 is conducted because the low frequency clock signal XCK2 is at a high level, to stabilize the node P(n) at the low preset potential VSS. In this state, the fourth transistors T42 and the fifth transistor T32 are closed because the node P(n) is at a low level. Therefore, the potentials of the control point Q(n) and the output terminal Out cannot be compacted by the stable module, regardless of how the potential of the previous-stage output signal ST(n−1) is. In other words, at this time, the potentials of the control point Q(n) and the output terminal Out can be stabilized at the low preset potential VSS by other stable modules.

Figure 5:
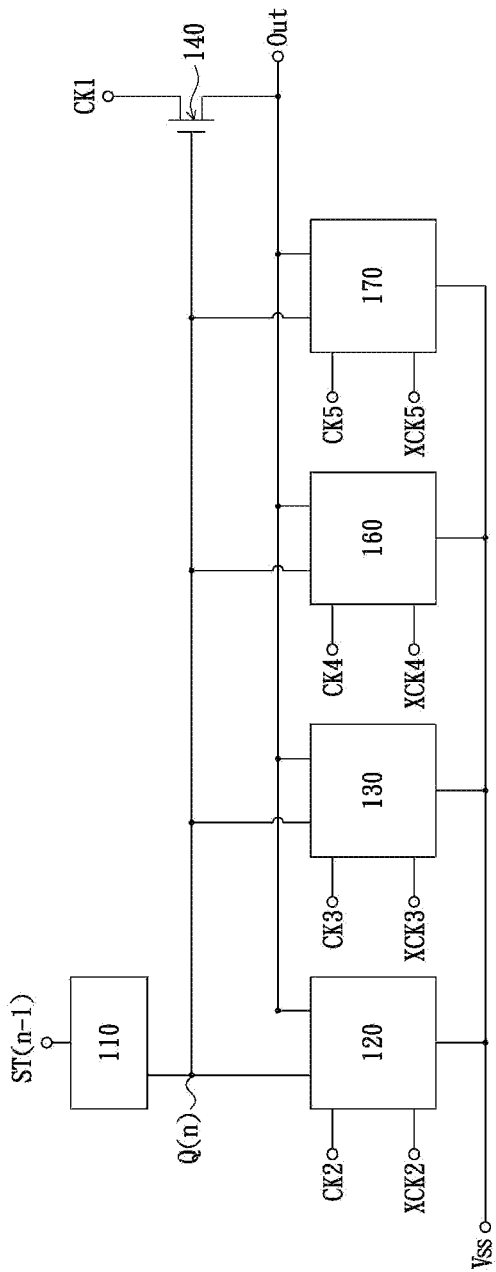
FIG. 5 is a block diagram of a gate-on array shift register according to another embodiment.

FIG. 5 is a block diagram of a gate-on array shift register according to another embodiment. The shift register shown in FIG. 5 is similar to the shift register shown in FIG. 2, but the shift register shown in FIG. 5 further comprises an additional stable module 170 comparing with the shift register shown in FIG. 2. In addition, because stable modules must be used to stabilize the potentials of the control point Q(n) and the output terminal Out of the shift register, the work cycles of the low frequency clock signal CK2, CK3, CK4 in the embodiment shown in FIG. 2 are required to enable at least one of the stable modules 120, 130, 160 to stabilize the potentials of the control point Q(n) and the output terminal Out. Similarly, the work cycles of the low frequency clock signal CK2, CK3, CK4, CK5 in the embodiment shown in FIG. 5 are required to enable at least one of the stable modules 120, 130, 160, 170 to stabilize the potentials of the control point Q(n) and the output terminal Out. Under normal conditions, the stable modules work alternately to stabilize the potentials of the control point Q(n) and the output terminal Out. That is, when the flat panel display displays images, the work cycles of the stable modules are required to ensure that one of the stable modules can stabilize the potentials of the control point Q(n) and the output terminal Out.

Figure 7:
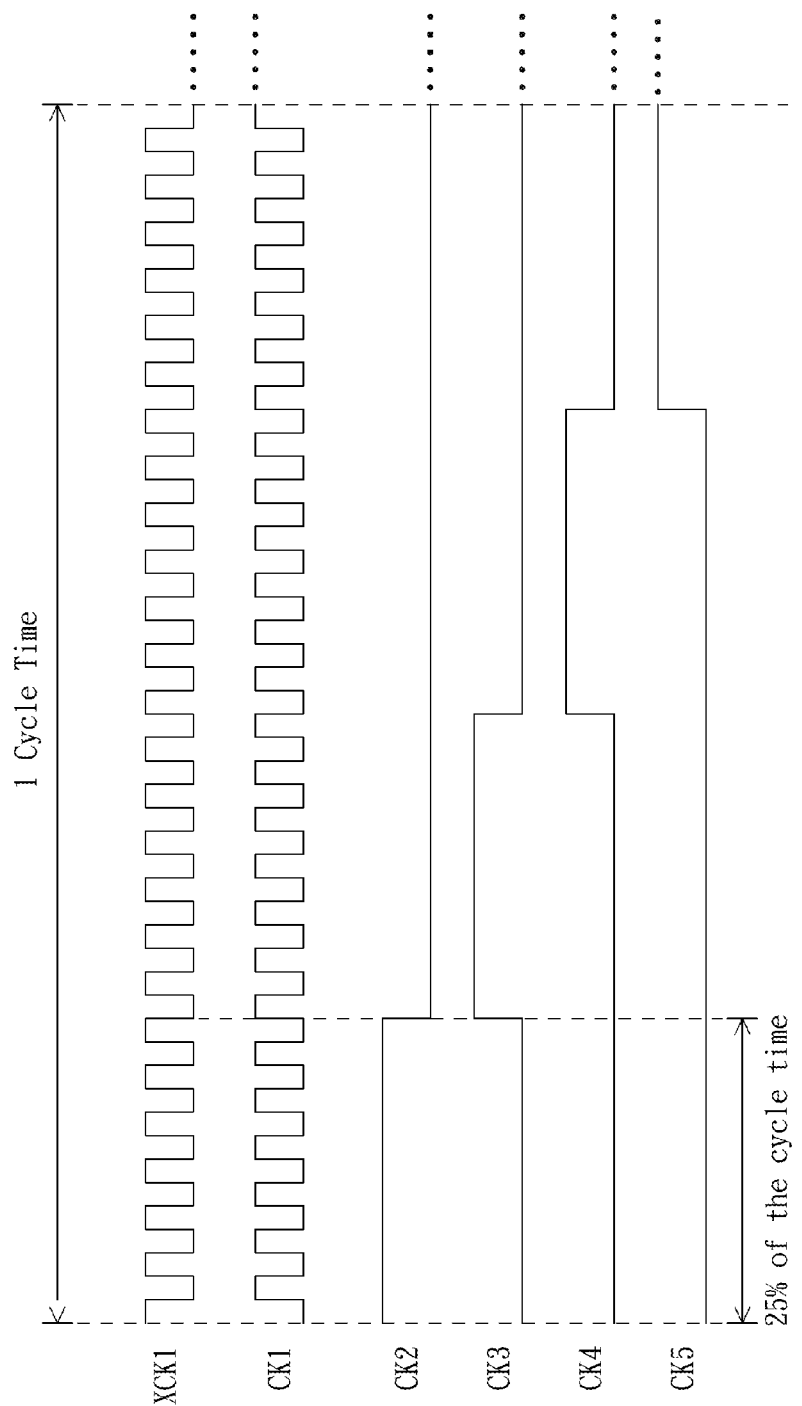
FIG. 7 is a timing diagram of various clock signals in the gate-on array shift registers of FIG. 5 and FIG. 6.

For example, if all of the low frequency clock signals have a same cycle time, then the easiest way is to evenly allocate the cycle time to all of the low frequency clock signals, so that each low frequency clock signal has a work cycle shorter than 50% of the cycle time. That is, for the shift register shown in FIG. 2, because the shift register uses three stable modules, then the work cycles of the low frequency clock signals CK2, CK3, CK4 can be set to be about 33%; for the shift register shown in FIG. 5, because the shift register uses four stable modules, then the work cycles of the low frequency clock signals CK2, CK3, CK4, CK5 can be set to be about 25% as shown in FIG. 7. However, these values about the work cycles are not fixed, but in order to minimize the damage on the transistors due to DC bias on the transistors for a long time, it is preferred that the low frequency clock signals have the same working time at a fixed time period.

Figure 6:
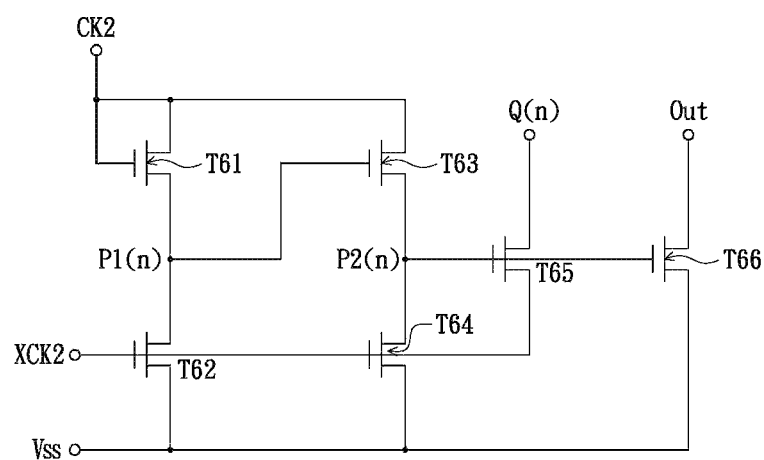
FIG. 6 is a circuit diagram of a stable module, according to another embodiment.

FIG. 6 is a circuit diagram of a stable module, according to another embodiment. Specifically, in this embodiment, the stable module includes a transistor T61, a transistor T62, a transistor T63, a transistor T64, a transistor T65 and a transistor T66. The gate terminal and one terminal of the transistors T61 receives the low frequency clock signal CK2, another terminal of the transistor T61 and a terminal of the transistors T62 are electrically coupled to the node P1(n). The gate terminal of the transistor T62 receives the reverse low frequency clock signal XCK2 which is reverse to the low frequency clock signal CK2, while the other terminal of the transistor T62 is electrically coupled to the low preset potential VSS. The gate terminal of the transistor T63 is electrically coupled to the node P1(n), a terminal of the transistor T63 receives the low frequency clock signal CK2, another terminal of the transistor T63 and a terminal of the transistor T64 are electrically coupled to the node P2(n). The gate terminal of the transistors T64 receives the inverse low frequency clock signal XCK2, and another terminal of the transistor T64 is electrically coupled to the low preset potential VSS. The gate terminal of the transistor T65 is electrically coupled to the node P2(n), a terminal of the transistor T65 is electrically coupled to the control point Q(n), another terminal of the transistor T65 receives the reverse low frequency clock signal XCK2. The gate terminal of the transistor T66 is electrically coupled to the node P2(n), a terminal of the transistor T65 is electrically coupled to the output terminal Out of the gate-on array shift register, another terminal of the transistor T65 is electrically coupled to the low preset potential VSS. Related operations is quite similar to those shown in FIG. 3 (B), and be not repeated here.

It is worthy to be noted that the stable modules can be different when at least three stable modules are used in the gate-on array shift register, so long as the stable modules can perform the same operation which is implemented by the circuits shown as FIG. 3 or FIG. 6, or by any other circuits.

Summarily, the embodiments can effectively eliminate shortcomings of the conventional shift register only using two stable modules, particularly eliminate the impact of DC bias for a long time on the transistors. Therefore, the transistor characteristics will be easier to maintain, and the overall stability of the circuits can also be kept for a more extended duration.

While the disclosure has been described in terms of what is presently considered to be the most practical embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A gate-on array shift register, comprising:
  a signal input unit, receiving and providing a input signal;
  a control transistor, comprising two terminals and a control terminal, the control terminal of the control transistor being electrically coupled to the signal input unit to receive the previous-stage output signal, one terminal of the control transistor being for receiving a first clock signal and another terminal of the control transistor being coupled to the output terminal of the gate-on array shift register, the control transistor being conducted at a first pulse period of the first clock pulse signal; and
  at least three stable modules, each of the at least three stable module being electrically coupled to the control terminal of the control transistor and the output terminal of the gate-on array shift register, and stabilizing the control terminal of the control transistor and the output terminal of the gate-on array shift register at a specific potential when a corresponding clock pulse signal and the previous-stage pulse signal are enabled, each of the stable modules having a work clock with a frequency different from the frequency of the first clock signal, and enable periods of the work clocks of the stable modules being different from each other and work cycles of the work clocks being respectively less than 50%.

2. The gate-on array shift register according to claim 1, wherein the signal input unit comprises a transistor, the transistor comprises two terminals and a control terminal, the control terminal of the transistor and one terminal of the transistor are electrically coupled together for receiving the previous-stage output signal, another terminal of the transistor is electrically coupled to the control terminal of the control transistor.

3. The gate-on array shift register according to claim 1, wherein each of the stable modules comprises:
  a first transistor, comprising a control terminal and two terminals, the control terminal and one terminal of the first transistor being electrically coupled and receiving a low frequency clock signal, another terminal of the first transistor being electrically coupled to a first node;

a second transistor, comprising a control terminal and two terminals, the control terminal of the second transistor receiving an inverse low frequency clock signal which is inverted to the low frequency clock signal, one terminal of the second transistor being electrically coupled to the first node, and another terminal of the second transistor being electrically coupled a preset potential;

a third transistor, comprising a control terminal and two terminals, the control terminal of the third transistor being electrically coupled to the control terminal of the control transistor, one terminal of the third transistor being electrically coupled to the first node, and another terminal of the third transistor being electrically coupled to the preset potential;

a fourth transistor, comprising a control terminal and two terminals, the control terminal of the fourth transistor being electrically coupled to the first node, one terminal of the fourth transistor being electrically coupled the control terminal of the control transistor, and another terminal of the fourth transistor being electrically coupled to output terminal of the gate-on array shift register; and a fifth transistor, comprising a control terminal and two terminals, the control terminal of the fifth transistor being electrically coupled to the first node, one terminal of the fifth transistor being electrically coupled to the output terminal of the gate-on array shift register, and another terminal of the fifth transistor being electrically coupled to the preset potential.

4. The gate-on array shift register according to claim 1, wherein the stable modules comprise same circuits.

5. The gate-on array shift register according to claim 1, wherein the stable modules comprise different circuits.

6. The gate-on array shift register according to claim 1, wherein the amount of the stable modules is four, and work cycle of the work clock of each stable module is 25%.

* * * * *